United States Patent
Choi et al.

(10) Patent No.: US 7,221,337 B1
(45) Date of Patent: May 22, 2007

(54) ELECTRO-LUMINESCENCE DISPLAY AND DRVING METHOD THEREOF

(75) Inventors: Woong Sik Choi, Ansan-shi (KR); Chang Wook Han, Seoul (KR); Sung Joon Bae, Sungnam-shi (KR)

(73) Assignee: LG. Philips LCD Co., Ltd., Seoul (KR)

(*) Notice: Subject to any disclaimer, the term of this patent is extended or adjusted under 35 U.S.C. 154(b) by 388 days.

(21) Appl. No.: 09/667,003

(22) Filed: Sep. 21, 2000

(30) Foreign Application Priority Data

Sep. 21, 1999 (KR) ............................... 1999-40744

(51) Int. Cl.
*G09G 3/30* (2006.01)

(52) U.S. Cl. ............................ 345/76; 345/77; 345/78; 345/89; 345/90; 345/92; 315/169.1; 315/169.3

(58) Field of Classification Search ................ 345/205, 345/206, 76, 92, 83, 77, 82, 45, 72, 89, 90, 345/91, 204; 257/59, 72, 286; 315/169.1–169.3; 313/498, 582; 349/42, 43
See application file for complete search history.

(56) References Cited

U.S. PATENT DOCUMENTS

| | | | |
|---|---|---|---|
| 4,644,338 A * | 2/1987 | Aoki et al. ................. 257/350 |
| 4,843,441 A * | 6/1989 | Willard ....................... 257/270 |
| 5,177,406 A * | 1/1993 | Troxell ..................... 315/169.1 |
| 5,550,066 A | 8/1996 | Tang et al. |
| 5,670,792 A | 9/1997 | Utsugi et al. |

* cited by examiner

*Primary Examiner*—Richard Hjerpe
*Assistant Examiner*—Jennifer T. Nguyen
(74) *Attorney, Agent, or Firm*—Birch, Stewart, Kolasch & Birch, LLP

(57) ABSTRACT

An electro-luminescence display which obtains proper color realization even though identical data driving waveforms are applied to each group of R, G and B pixel cells. In the display, a plurality of data lines cross a plurality of gate lines to define a plurality of pixel cell areas. A plurality of power supply lines pass through the pixel cell areas. A switching device is provided in each pixel cell area in such a manner to be electrically connected to the gate line and the data line. A plurality of driving devices are patterned based on a ratio of channel width to channel length in accordance with the type of pixel cell area. Each driving device having a gate connected to one electrode of the switching device and a source connected to the power supply line at each of the pixel cell areas. A plurality of EL diodes are connected to the plurality of driving devices, respectively. A wiring is commonly connected to the plurality of power supply lines. The R, G and B pixel cells are independently driven using different currents, although a common voltage is received by the driving devices.

25 Claims, 4 Drawing Sheets

ELECTRO-LUMINESCENCE DISPLAY AND DRVING METHOD THEREOF

BACKGROUND OF THE INVENTION

1. Field of the Invention

This invention relates to an electro-luminescence display (ELD), and more particularly to an active matrix ELD and a method of driving the same.

2. Description of the Related Art

The ELD is a display device in which electrons and holes are injected from the exterior thereof to re-combine the electrons with the holes and thus produce excited molecules so as to exploit the luminescence of these excited molecules. ELD devices are gaining popularity, due to their thin display panel size and relatively low power consumption, because ELDs do not require a backlight device.

FIG. 1 is an equivalent circuit diagram of a unit cell in the conventional ELD. In FIG. 1, a plurality of gate lines G cross a plurality of data lines D to define pixel cell areas therebetween. In the pixel cell area, a power supply line L is arranged in parallel to the data line D. Alternatively, the power supply line L may be arranged in parallel to the gate line G. The pixel cell area includes a switching device T1, a driving device T2, a storage capacitor C and an electro-luminescent (EL) diode EL. The switching device T1 has a gate connected to the gate line G, a source connected to the data line and a drain connected to a gate of the driving device T2. The drain of the driving device T2 is connected to an anode (+) of the EL diode EL while the source thereof is connected to the power supply line L. A storage capacitor C is connected between the gate of the driving device T2 and the power supply line L. A cathode (−) of the EL diode EL is connected to a common electrode terminal 10.

In the ELD having the structure as described above, if the gate line G connected to the switching device T1 is selected by a gate driver (not shown) to be turned on, then a data signal from the data line D connected to the switching device T1 is stored in the storage capacitor C. When the switching device T1 is turned off, a voltage of the storage capacitor C is maintained until the gate line G is selected again. At this time, the storage capacitor C has a voltage applied between the gate and the source of the driving device T2. Thus, a source current determined in accordance with a gate voltage of the driving device T2 arrives at the common electrode 10, via the driving device T2 and the EL diode EL, from the power supply line L. In this operational process, the EL diode EL becomes luminous. In this manner, the driving device T2 responds to a selecting signal applied to the gate line G, and to a data signal applied to the data line D to control a current flowing through the driving device T2 from the power supply line L. The EL diode EL is luminous at a desired magnitude of brightness corresponding to the magnitude of current applied by the driving transistor T2. For example, if a certain gate voltage is applied to the gate of the driving device T2, then the magnitude of a current passing through the driving device T2 is determined. Accordingly, the magnitude of a current flowing through the EL diode EL also is determined.

FIG. 2 is a view showing the structure of a conventional ELD, which illustrates a substrate on which a pixel cell emitting a red light (R), a pixel cell emitting a green light (G) and a pixel cell emitting a blue light (B) are arranged. Since the basic structure of each pixel cell, with the exception of the driving devices, is identical to those described above with reference to FIG. 1, an explanation of the same elements will be omitted for the sake of brevity. In FIG. 2, a number of gate lines G1, G2, etc. cross a number of data lines D1, D2, D3, etc. to define a number of pixel cell areas therebetween. Each pixel cell area includes power supply lines L1, L2, L3, etc. The power supply lines L1, L2, L3, etc. provided in each pixel cell area are commonly connected to a single wiring 20 to commonly receive a voltage from a supply voltage terminal 21. Each pixel cell area is provided with a switching device T1, a driving device T2, a storage capacitor C and an EL diode EL. A common electrode terminal 22 plays a role to connect the EL diodes EL with one another. Each pixel cell can be defined as a "R" pixel cell emitting red light, a "G" pixel cell emitting green light and a "B" pixel cell emitting blue light, depending on the luminous color which each EL material constructing the EL diode EL emits. The R, G and B pixel cells are arranged in such a manner that three pixel cells make a group.

The group comprising an R pixel cell, G pixel cell and B pixel cell determines and displays a single color y, which is the combination of three colors. The display has a different color design in accordance with how to revive a color in accordance with various environmental conditions. A realization of the selected white color according to how to combine basic color (i.e., R, G and B), lights, which is hereinafter referred to as "white balance", is determined by the chromaticity and brightness of the basic colors.

As shown in FIG. 3, however, each EL diode EL of the R, G and B pixel cells has a different brightness characteristic according to the applied current. In other words, when a current with the same magnitude flows in each pixel cell, the EL diode R-EL of the R pixel cell, the EL diode G-EL of the G pixel cell and the EL diode B-EL of the B pixel cell have a brightness magnitude different from one another. In the ELD, the brightness of red, blue and green lights required to meet the white balance is different from one another. This is because the EL materials making up the EL diode EL in each pixel cell are different.

Therefore, the conventional ELD fails to provide proper light realization even when identical driving waveforms are applied to each pixel cell. In other words, since the brightness according to a current flowing in each EL material composing the EL diode is different, a brightness required for each pixel cell can not be achieved like in a liquid crystal display (LCD) employing a color filter when applying identical data driving waveforms to the R, G and B pixel cells.

Accordingly, it is necessary to configure such a data driver that can independently drive the R, G and B cells for the sake of driving the ELD. As a result, the conventional ELD has the problems of a complicated design and a high production cost.

SUMMARY OF THE INVENTION

The present invention provides an electro-luminescence display which can obtain proper color realization even though identical data driving voltages are applied to each group of R, G, and B pixel cells. This is achieved making a transistor in each driving circuit for an R pixel cell, a G pixel cell, and a B pixel cell to have a different structure, respectively. In particular, the transistors have a channel length and a channel width, the channel length and channel width forming a ratio; the ratio for each type of pixel cell being different such that each transistor has a different structure to allow an appropriate current to flow through the pixel cell and achieve the requisite brightness level of illumination thereof.

BRIEF DESCRIPTION OF THE DRAWINGS

These and other objects of the invention will be apparent from the following detailed description of the embodiments of the present invention with reference to the accompanying drawings, in which.

DETAILED DESCRIPTION OF THE PREFERRED EMBODIMENT

Figure 1:
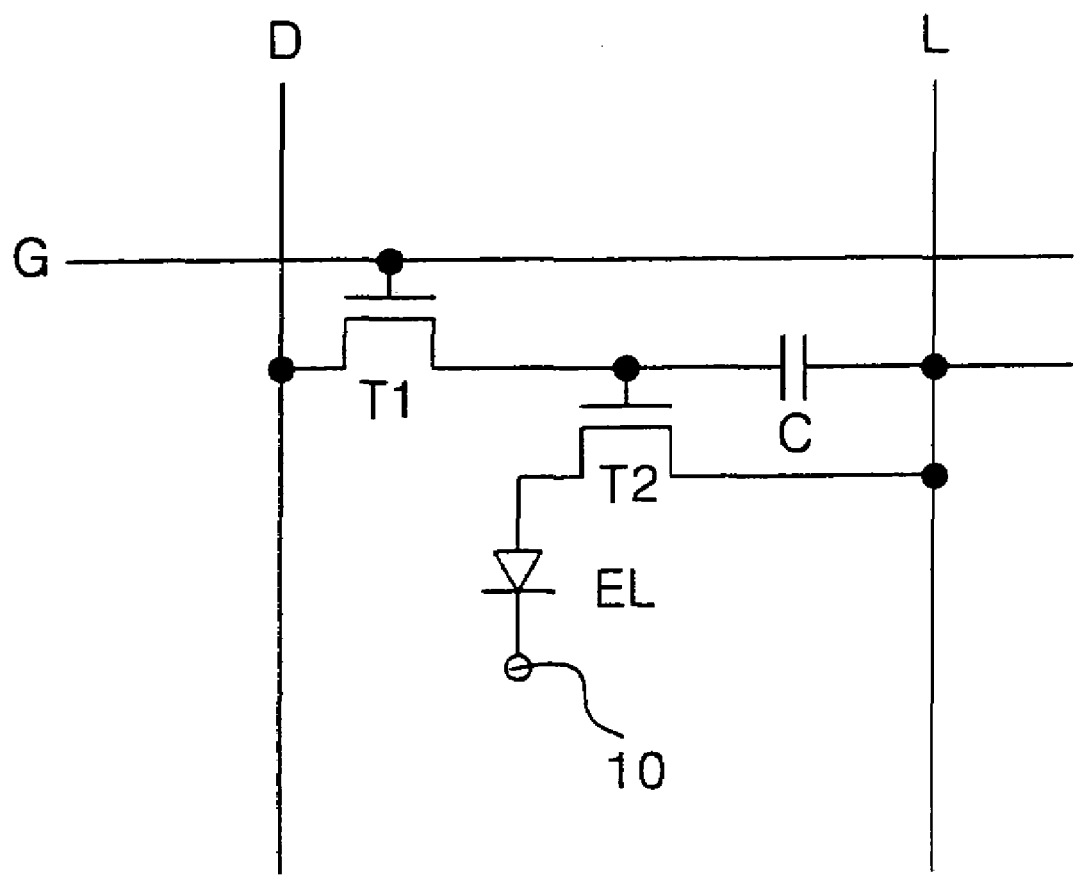
FIG. 1 is a schematic equivalent circuit diagram of a unit pixel cell in the conventional electro-luminescence display.
Figure 2:
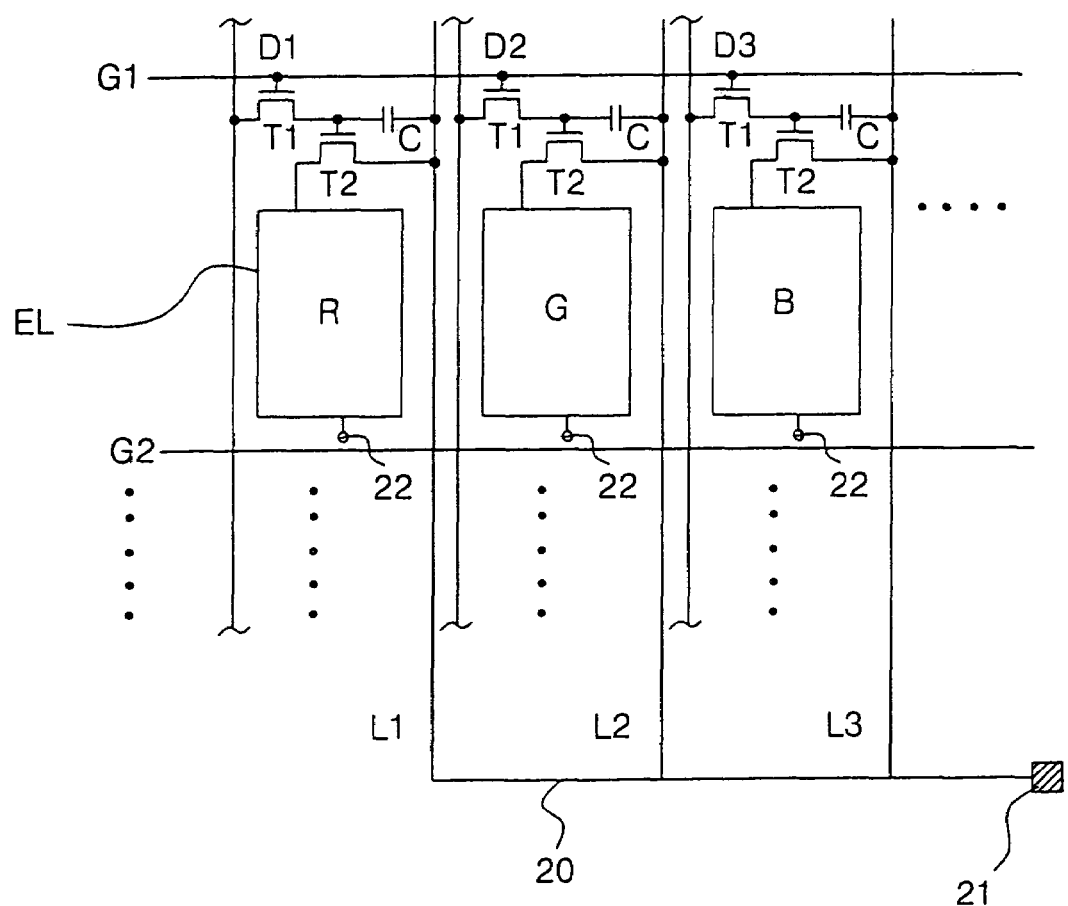
FIG. 2 is a view showing a structure of the conventional ELD.
Figure 4:
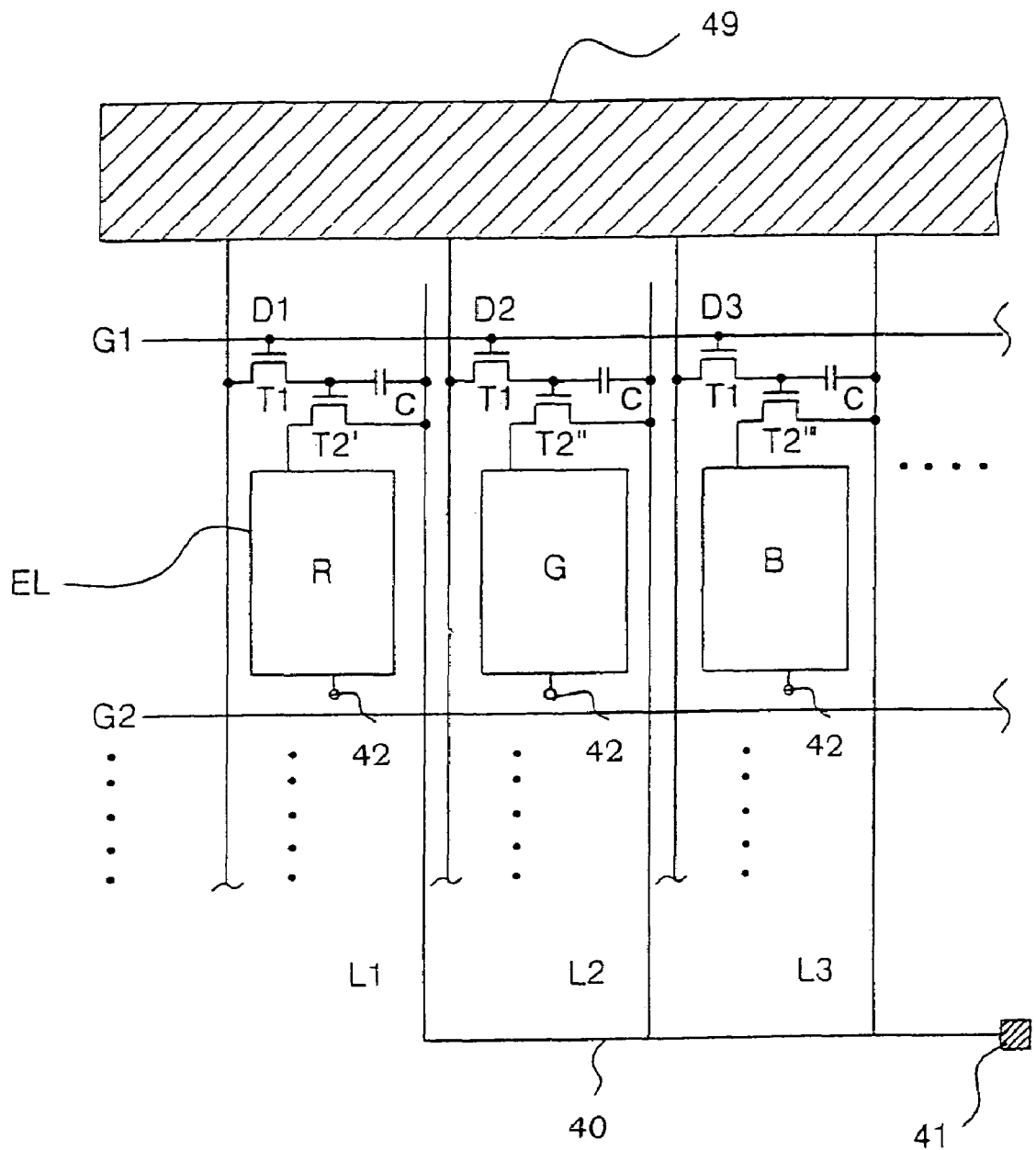
FIG. 4 is a view showing the structure of an ELD according to an embodiment of the present invention.

Referring to FIG. 4, there is shown an electro-luminescence display (ELD) according to an embodiment of the present invention. The ELD has a substrate on which pixel cells emitting red (R), green (G) and blue (B) lights are arranged. The basic elements of each pixel cell, with the exception of the driving devices (transistors) are identical to those in FIG. 1 as described above, and thus an explanation as to the same parts will be omitted.

In FIG. 4, a number of gate lines G1, G2, etc. cross a number of data lines D1, D2, D3, etc. to define a number of pixel cell areas. At each pixel cell area, power supply lines L1, L2, L3, etc. are arranged in parallel to the data line D1, D2, D3, etc. The power supply lines L1, L2, L3, etc. may be arranged in parallel to the gate lines gate lines G1, G2, etc. Each pixel cell area is provided with a switching device T1, driving device T2', T2", T2"', a storage capacitor C and an EL diode EL. Each pixel cell can be defined as an "R" pixel cell emitting a red light, a "G" pixel cell emitting a green light and a "B" pixel cell emitting a blue light, depending on the luminous color which each EL material emits. The R, G and B pixel cells are arranged in such a manner to make a group. In this case, driving devices T2', T2", and T2"' located in each pixel cell are provided such that a ratio of channel width to channel length, hereinafter referred to as "size of the driving device" has a desired value different from each other.

The driving devices, T2', T2" and T2"' usually are driven at the saturation area. At this time, a driving current I flowing in the driving device is determined by the following equation:

$$I = (1/2)\mu_n C_o (W/L)(V_{GS} - V_{TH})^2 \quad (1)$$

wherein $\mu_n$ represents a mobility of electric field; $C_o$ is a capacitance of a gate insulating film; W is a channel width; L is a channel length; $V_{GS}$ is a voltage between the gate and the source; and $V_{TH}$ is a threshold voltage. It can be seen from equation (1) that, even when the same driving voltage $V_{GS}$ is applied to the different driving devices T2', T2" and T2"', if a size of one driving device is different from the size of another driving device, different magnitudes of current flow through the driving devices. To obtain the desired differences between the W/L ratios of the driving devices T2', T2" and T2"', each of the driving devices T2', T2" and T2"' has the same L but different W. On the other hand, each of the driving devices T2', T2" and T2"' can have the same W but different L.

Figure 3:
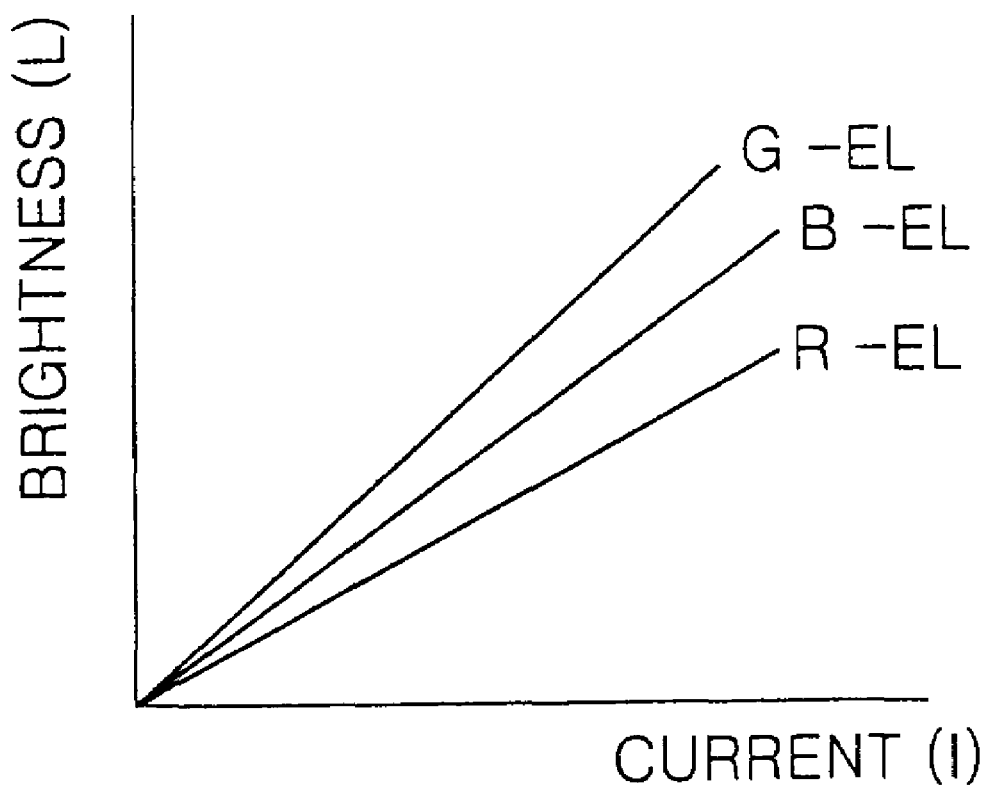
FIG. 3 is a brightness characteristic diagram according to a current of the EL diode.

Accordingly, when the driving devices T2', T2", and T2"' have a different size each of the R, G, and B pixel cells have a different magnitude of current flowing therethrough to the respective EL diode EL even though the same data driving waveform (voltage) is applied to the driving devices T2', T2" and T2"'. At this time, in the driving devices T2', T2", and T2"' provided at each of the R, G, and B pixel cells, a required current amount is calculated in consideration of an electrical characteristic of the EL diode EL provided at each pixel cell and a white balance to thereby control their sizes. For example, as shown in FIG. 3, for a given level of brightness, the R pixel cell requires the most current, while the G pixel cell requires the least current. The required level of current is determined by the width and length of the transistor in the driving devices T2', T2" and T2"'. For example, the W/L ratio for the R pixel cell is set greater than the W/L ratio of the B pixel cell. Similarly, the W/L ratio of the B pixel cell is set greater than that of the G pixel cell. In this manner, the structure of the transistor in each driving device T2', T2" and T2"' allows a different amount of current to pass therethrough, in order to illuminate the pixels at the requisite levels of brightness. For example, the current passing through the R pixel cell is greater than that passing through the B pixel cell and the current passing through the B pixel cell is greater than that passing through the G pixel cell so that the brightness levels achieved at the respective R, B and G pixel cells are substantially equal.

It will be appreciated based on the foregoing that it is a matter of design choice to select the W/L ratios of the respective driving devices T2', T2" and T2"' to achieve the desired current through the associated R, G and B EL-diodes; and thereby achieve the desired white balance (i.e., respective brightness levels).

A first power supply line L1 passing through the R pixel cell, a second power supply line L2 passing through the G pixel cell and a third power supply line L3 passing through the B pixel cell are commonly connected to a power supply terminal 41. Thus, a common voltage is applied to each power supply line L1, L2 and L3 passing through each R, G and B pixel cell.

A driving method of the ELD having the configuration as mentioned above will be described below. First, a gate signal is applied from a gate driving circuit (not shown) to the first gate line G1 to activate the switching device T1 of each pixel cell connected to the first gate line G1 and thus turn on it. A data voltage from the data driving circuit 49 is sequentially applied to the turned-on pixel cells. At this time, the same data driving waveform is applied to a group of R, G and B pixel cells.

The data voltage applied in this manner is stored, via each switching device T1, into a storage capacitor C. If the switching device T1 is turned off, then a voltage of the storage capacitor is maintained until the first gate line G1 is selected again. Each storage capacitor C has a voltage VGS applied between the gate and the source of each driving device T2', T2" or T2"'. A single supply voltage set by the power supply voltage terminal 41 is commonly applied to each power supply line L1, L2 and L3 provided in the pixel cell, thereby allowing a current to flow from each power supply line, via each driving device T2', T2" or T2"', into each EL diode EL. A source current determined by the driving device T2', T2" or T2"' arrives from the power supply line L1, L2 or L3, via each driving device T2', T2" or T2"' and the EL diode EL, at the common electrode 40. In this process, the EL diode EL is luminous. As described above, the driving device T2', T2" or T2"' responds to a selection signal applied to the gate line G and the data line D selectively to control a current passing through the driving device T2', T2" and T2"' from the power supply line L1, L2 or L3. In the present invention, driving devices with a different size are provided in each of the R, G and B pixel cells, so that a desired current with a different magnitude flows in the EL diode EL of each pixel cell even though the same data driving waveform is applied to each pixel cell. Accordingly, the EL diode EL is luminous into a desired magnitude of brightness in accordance with the applied current. As described above, the magnitude of a current flowing through the power supply line is controlled while passing through the driving device. This current magnitude is determined by a device dimension of the driving circuit at each pixel cell. As mentioned earlier, the dimension of the driving devices T2', T2" and T2''' provided at each of the R, G and B pixel cells is controlled by calculating a required current amount in consideration of an electrical characteristic of the EL diode EL provided in each pixel cell and the white balance. As a result, a current passing through the EL diode EL in each of the R, G and B pixel cells complies with a required brightness for each pixel cell, so that each pixel cell is able to realize an accurate color.

As described above, according to the present invention, a current amount required for each of the R, G and B pixel cells is controlled in accordance with a dimension of the driving device, so that an accurate color realization can be obtained even though the same data driving waveform is applied to each pixel cell. Accordingly, the R, G and B pixel cells can be independently driven even when a complex driving device is not included in the data driving circuit. As a result, the ELD according to the present invention has an advantage in that the design of the data driving circuit can be simplified to thus lower its manufacturing cost.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. An electro-luminescence display device, comprising:
   a first electro-luminescence diode for a first pixel for displaying a first color, the first electro-luminescence diode having a first electrical characteristic;
   a second electro-luminescence diode for a second pixel for displaying a second color, the second electro-luminescence diode having a second electrical characteristic;
   a first driving circuit which receives a first driving voltage and applies a first driving current to the first electro-luminescence diode;
   a second driving circuit which receives a second driving voltage equal to the first driving voltage and applies a second driving current different from the first driving circuit to the second electro-luminescence diode, a difference between the first driving current and the second driving current being set based on a difference between the first electrical characteristic of the first electro-luminescence diode and the second electrical characteristic of the second electro-luminescence diode;
   a first data line supplying a first data voltage to the first driving circuit;
   a second data line supplying a second data voltage to the second driving circuit;
   a first power supply line supplying a first common voltage to the first driving circuit; and
   a second power supply line supplying a second common voltage to the second driving circuit,
   wherein the first data voltage and the second data voltage are substantially equal, the first common voltage and the second common voltage are substantially equal, and the first driving current and the second driving current are different.

2. The device of claim 1, wherein the first driving circuit and the second driving circuit have a different structure.

3. The device of claim 2, wherein:
   the first driving circuit comprises a first transistor having a first channel width and a first channel length, the first channel width to the first channel length being a first ratio; and
   the second driving circuit comprises a second transistor having a second channel width and a second channel length, the second channel width to the second channel length being a second ratio, the first and second ratios being different.

4. The device of claim 3, wherein the first pixel cell is a R pixel cell and the second pixel cell is a B pixel cell, and the first ratio is greater than the second ratio.

5. The device of claim 3, wherein the first pixel cell is a R pixel cell, and the second pixel cell is a G pixel cell, and the first ratio is greater than the second ratio.

6. The device of claim 3, wherein the first pixel cell is a B pixel cell, and the second pixel cell is a G pixel cell.

7. The device of claim 1, wherein the first pixel cell is a R pixel cell and the second pixel cell is a B pixel cell, and first driving current is greater than the second driving current.

8. The device of claim 1, wherein the first pixel cell is a R pixel cell and the second pixel cell is a G pixel cell, and the first driving current is greater than the second driving current.

9. The device of claim 1, wherein the first pixel cell is a B pixel cell and a second pixel cell is a G pixel cell, and the first driving current is greater than the second driving current.

10. The device of claim 1, further comprising:
    a third electro-luminescence diode for a third pixel for displaying a third color, the third electro-luminescence diode having a third electrical characteristic; and
    a third driving circuit which receives a third driving voltage and applies a third driving current to the third electro-luminescence diode,
    wherein the first, second and third driving voltages are equal, and the first, second and third driving currents are different, whereby the first, second and third pixel cells are independently driven.

11. The device of claim 10, wherein the first, second and third driving circuits have a different structure, respectively.

12. The device of claim 11, wherein:
    the first driving circuit comprises a first transistor having a first channel width and a first channel length, the first channel width to the first channel length being a first ratio;
    the second driving circuit comprises a second transistor having a second channel width and a second channel length, the second channel width to the second channel length being a second ratio; and
    the third driving circuit comprises a third transistor having a third channel width and a third channel length, the third channel width to the third channel length being a third ratio,
    the first, second and third ratios being different, respectively.

13. The device of claim 12, wherein the first, second and third pixel cells are R, B, G pixel cells, respectively.

14. The device of claim 13, wherein a brightness level of the first, second and third colors are substantially equal.

15. The device of claim 10, wherein:
the first, second and third pixel cells are R, B and G pixel cells, respectively;
the first current is greater than the second current; and
the second current is greater than the third current.

16. An electro-luminescence display device, comprising:
a first electro-luminescence diode for a first pixel cell, the first electro-luminescence diode having a first electrical characteristic;
a first driving circuit which drives the first electro-luminescence diode, the first driving circuit including a first transistor having a first channel width and a first channel length, the first channel width to the first channel length being a first ratio;
a second electro-luminescence diode for a second pixel cell, the second electro-luminescence diode having a second electrical characteristic;
a second driving circuit which drives the second electro-luminescence diode, the second driving circuit including a second transistor having a second channel width and a second channel length, the second channel width to the second channel length being a second ratio different from the first ratio, a difference between the first ratio and the second ratio being set based on a difference between the first electrical characteristic of the first electro-luminescence diode and the second electrical characteristic of the second electro-luminescence diode;
a first data line supplying a first data voltage to the first driving circuit;
a second data line supplying a second data voltage to the second driving circuit;
a first power supply line supplying a first common voltage to the first driving circuit; and
a second power supply line supplying a second common voltage to the second driving circuit,
wherein the first data voltage and the second data voltage are substantially equal, the first common voltage and the second common voltage are substantially equal, and the first driving current and the second driving current are different.

17. The device of claim 16, wherein:
the first and second driving circuits drive the first and second pixel cells, respectively;
the first pixel cell is a R pixel cell and the second pixel cell is a B pixel cell; and
the first ratio is greater than the second ratio.

18. The device of claim 16, further comprising:
a third electro-luminescence diode for a third pixel cell, the third electro-luminescence diode having a third electrical characteristic; and
a third driving circuit which drives the third electro-luminescence diode, the third driving circuit including a third transistor having a third channel width and a third channel length, the third channel width to the third channel length being a third ratio,
the first, second and third ratios being different, respectively.

19. The device of claim 18, wherein:
the first, second and third driving circuits drive the first, second and third pixel cells, respectively;
the first pixel cell is a R pixel cell, the second pixel cell is a B pixel cell and the third pixel cell is a G pixel cell; and
the first ratio is greater than the second ratio, and the second ratio is greater than the third ratio.

20. A method of forming an electro-luminescence display device, comprising:
forming a plurality of gate lines and a plurality of data lines to form a lattice configuration, a first one of the data lines supplying a first data voltage to a first driving circuit, a second one of the data lines supplying a second data voltage to a second driving circuit;
forming a plurality of power supply lines, a first one of the power supply lines supplying a first common voltage to the first driving circuit, a second one of the power supply lines supplying a second common voltage to the second driving circuit;
forming a plurality of pixel cells between the gate lines and the data lines, each pixel cell including an electro-luminescence diode with an electrical characteristic; and
forming a driving transistor for each pixel cell based on the electrical characteristic of the electro-luminescence diode of each pixel cell, so that different driving currents from the driving transistors are applied to the pixel cells having different colors for independently driving the pixel cells, a difference among the different driving currents being set based on a difference among the electrical characteristics of the electro-luminescence diodes;
wherein the first data voltage and the second data voltage are substantially equal, the first common voltage and the second common voltage are substantially equal, and the first driving current and the second driving current are different.

21. The method of claim 20, further comprising a step of forming a plurality of pixel groups, each group having an R pixel cell, a G pixel cell, and a B pixel cell.

22. The method of claim 21, wherein the driving transistor for the R pixel cell, for the G pixel cell, and for the B pixel cell are formed differently.

23. The method of claim 22, wherein the driving transistors are formed to have different channel widths and channel lengths.

24. The method of claim 23, wherein the channel widths and channel lengths are determined based on whether the driving transistor is for the R pixel cell, for the G pixel cell, or for the B pixel cell.

25. A method of forming a electro-luminescence display device, comprising:
forming a first data line supplying a first data voltage to a first driving circuit;
forming a second data line supplying a second data voltage to a second driving circuit;
forming a first power supply line supplying a first common voltage to the first driving circuit;
forming a second power supply line supplying a second common voltage to the second driving circuit;
forming a first electro-luminescence diode for a first pixel cell, the first electro-luminescence diode having a first electrical characteristic;
forming a first driving circuit including forming a first transistor having a first channel width and a first channel length for driving the first electro-luminescence diode, the first channel width to the first channel length being a first ratio;

forming a second electro-luminescence diode for a second pixel cell, the second electro-luminescence diode having a second electrical characteristic;

forming a second driving circuit including forming a second transistor having a second channel width and a second channel length for driving the second electro-luminescence diode, the second channel width to the second channel length being a second ratio different from the first ratio, a difference between the first ratio and the second ratio being set based on a difference between the first electrical characteristic of the first electro-luminescence diode and the second electrical characteristic of the second electro-luminescence diode, wherein the first data voltage and the second data voltage are substantially equal the first common voltage and the second common voltage are substantially equal, and the first driving current and the second driving current are different.

* * * * *